United States Patent [19]

Hartstein

[11] Patent Number: 5,172,204
[45] Date of Patent: Dec. 15, 1992

[54] ARTIFICIAL IONIC SYNAPSE
[75] Inventor: Allan M. Hartstein, Chappaqua, N.Y.
[73] Assignee: International Business Machines Corp., Armonk, N.Y.
[21] Appl. No.: 676,135
[22] Filed: Mar. 27, 1991
[51] Int. Cl.$^5$ ............................................. H01L 29/78
[52] U.S. Cl. .................................. 307/201; 257/314; 257/405
[58] Field of Search .................. 357/23.12, 6, 41; 307/201

[56] References Cited

U.S. PATENT DOCUMENTS

| | | |
|---|---|---|
| 3,341,754 | 9/1967 | Kellett et al. |
| 3,922,567 | 11/1975 | Adam et al. ............... 357/23.12 |
| 3,933,530 | 1/1976 | Mueller et al. ............... 357/91 |
| 4,240,096 | 12/1980 | Hiraki et al. |
| 4,270,136 | 5/1981 | Toyokura et al. ............... 357/52 |
| 4,868,615 | 9/1989 | Kamata . |
| 4,950,917 | 8/1990 | Holler et al. ............... 307/201 |
| 4,956,564 | 9/1990 | Holler et al. ............... 307/201 |
| 4,978,631 | 12/1990 | Blanchard ............... 357/23.12 |
| 5,010,512 | 4/1991 | Hartstein et al. ............... 307/201 |
| 5,028,810 | 7/1991 | Castro et al. ............... 307/201 |

FOREIGN PATENT DOCUMENTS

0349007A2 1/1990 European Pat. Off. .

OTHER PUBLICATIONS

"Programmable Associative Memory Implemented in Silicon Technology" IBM Technical Disclosure Bulletin, vol. 31, No. 7, Dec. 1988.

Primary Examiner—Andrew J. James
Assistant Examiner—Courtney A. Bowers
Attorney, Agent, or Firm—Perman & Green

[57] ABSTRACT

An artificial neural synapse (10) is constructed to function as a modifiable excitatory synapse. In accordance with an embodiment of the invention the synapse is fabricated as a silicon MOSFET that is modified to have ions within a gate oxide. The ions, such as lithium, sodium, potassium or fluoride ions, are selected for their ability to drift within the gate oxide under the influence of an applied electric field. In response to a positive voltage applied to a gate terminal of the device, positively charged ions, such as sodium or potassium ions, drift to a silicon/silicon dioxide interface, causing an increase in current flow through the device. The invention also pertains to assemblages of such devices that are interconnected to form an artificial neuron and to assemblages of such artificial neurons that form an artificial neural network.

11 Claims, 2 Drawing Sheets

ARTIFICIAL IONIC SYNAPSE

FIELD OF THE INVENTION

This invention relates generally to electronic devices and, in particular, to electronic devices having a region containing mobile ions that drift under the influence of an applied electric field. The invention also relates to artificial excitatory neural synapses and to artificial neurons and neural networks incorporating such synapses.

BACKGROUND OF THE INVENTION

In networks of neurons found in biological systems one of the most important elements has been found to be the interconnection between different neurons. This interconnection is referred to as a synapse. A neuron operates to integrate inputs, which enter the neuron from synaptic junctions located primarily on nerve structures known as dendrites, and to generate an output which is propagated on the neuron's axon. The output of the neuron is transmitted to other neurons by means of additional synapses between the axon and the dendrites on the other neurons. Networks of neurons, interconnected in this manner, provide the diverse functions of the central nervous system.

There are two types of synapses, excitatory and inhibitory. The excitatory synapses have the effect of enhancing the output of the target neuron. That is, electrical pulses entering through an excitatory synapse tend to promote the generation of electrical pulses in the neuron. Conversely, inhibitory synapses have the effect of suppressing the output of the neuron. Although the present understanding of the functioning of neurons is limited, it appears that the inhibitory synapses are fixed in strength, whereas the strength of the excitatory synapses is modifiable. That is, the effect of an excitatory synapse upon the neuron varies over time as a function of the input to the synapse.

An important factor in the operation of biological neurons is the chemical and electrochemical environment of the neurons. For example, it is known that the diffusion of ions, such as sodium and potassium, into and out of the nerve cell forms the underlying mechanism for generating the electrical potential of the nerve cell.

An artificial neural network is a system having arbitrary computational properties that is constructed from elements that exhibit neuron-like properties. The elements may be simulated in software or constructed from electrical or electronic components.

By example, European Application No. 0349007 discloses a semiconductor integrated circuit for constructing a neural network model and includes an inhibitory and an excitatory synapse circuit.

Hiraki et al. in U.S. Pat. No. 4,240,096 disclose a semiconductor device comprising a fluorine ion implantation region which is selectively formed in a semiconductor region and further activated. Fluorine ions are implanted in the selected portion of the semiconductor regions, followed by heat treatment. The implanted fluorine ions are provided to act as a carrier trap to extinguish carrier electrons.

In a publication by A. M. Hartstein et al., IBM Technical Disclosure Bulletin, Vol. 31, No. 7, December 1980, pages 254–257, entitled "Programmable Associative Memory Implemented in Silicon Technology" an associative memory network is described that includes the use of a single MOSFET device which interconnects other elements of the network and which functions as a threshold switch. To control threshold voltages of the MOSFET, the gate region may be ion implanted. A preferred technique is said to employ charge that is injected and trapped within individual gate oxides.

Other U.S. Patents include the following. U.S. Pat. No. 3,341,754, issued Sep. 12, 1967, entitled "Semiconductor Resistor Containing Interstitial and Substitutional Ions Formed by an Ion Implantation Method" to C. M. Kellett et al. discloses the implantation of boron or phosphorous into silicon during the fabrication of a resistor. U.S. Pat. No. 4,868,615, issued Sep. 19, 1989, entitled "Semiconductor Light Emitting Device Using Group I and Group VII Dopants" to Kamata discloses the implantation of compound semiconductors in the formation of light emitting devices.

SUMMARY OF THE INVENTION

In accordance with an embodiment of the invention an artificial synapse is fabricated as a silicon MOSFET that is modified to include ions within a gate oxide. The ions, such as lithium, sodium, potassium or fluoride ions, are selected for their ability to drift within the gate oxide under the influence of an applied electric field. In response to a positive voltage applied to a gate terminal of the device positively charged ions, such as sodium or potassium ions, drift to a silicon/silicon dioxide interface, causing an increase in current flow through the device. The invention also pertains to assemblages of such devices that are interconnected to form an artificial neuron and to assemblages of such artificial neurons that form an artificial neural network.

More specifically, the invention teaches an artificial excitatory synapse comprised of an electrical device that includes a region having mobile ions contained therein. The mobile ions are responsive to an electrical potential applied to an input terminal of the device for modifying a conduction of electrical current through the device. In an exemplary embodiment the artificial excitatory synapse is comprised of a Metal Oxide Semiconductor Field Effect Transistor (MOSFET) device having a substrate, a source electrode coupled to a source region formed within the substrate, a drain electrode coupled to a drain region formed within the substrate, and a gate terminal. The gate terminal is disposed between the source region and the drain region for inducing a channel region within the substrate in response to an electrical potential applied to the gate terminal. The gate terminal is spaced apart from the substrate by a layer of electrically insulating material that includes ions of a type selected for being mobile within the electrically insulating material. As a result of an electrical potential applied to the gate terminal the ions migrate within the electrically insulating material in such a manner as to increase or decrease an electrical conductivity of the channel region so as to reinforce the effect of the applied potential.

By example, the electrically insulating material is comprised of $SiO_2$ and the ions are selected from the group consisting of ions of Li, Na, K, and F. Further by example, the substrate is comprised of p-type silicon and the source region and the drain region are each comprised of n+ silicon.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
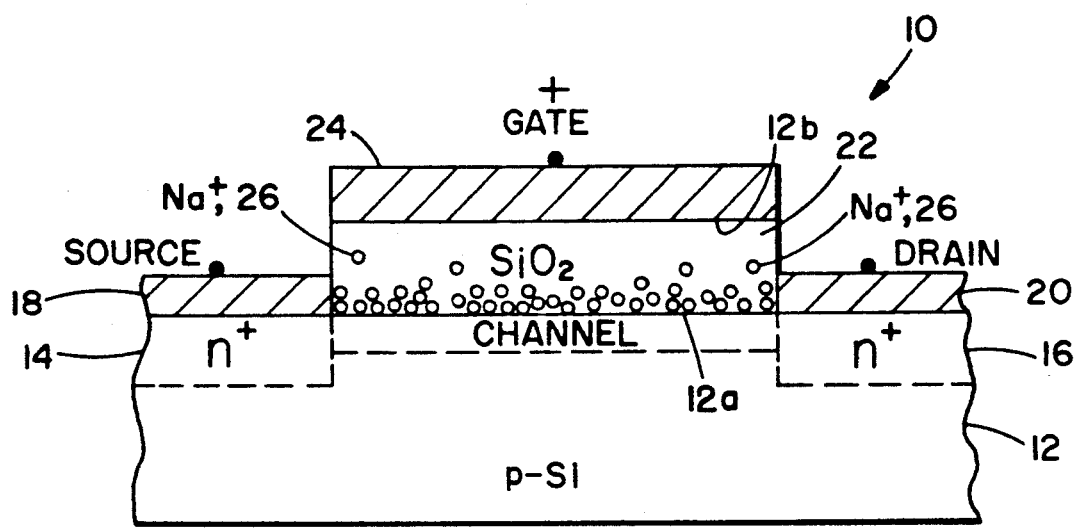
FIG. 1 is a cross-sectional view, not to scale, depicting an artificial ionic synapse that is constructed and operated in accordance with the invention.

Referring to FIG. 1 there is shown in cross-section a three terminal Ionic Synapse Device (ISD) 10 that is constructed and operated in accordance with the invention. Device 10 has the general construction of a Metal Oxide Semiconductor Field Effect Transistor (MOSFET) device and includes a semiconductor substrate 12, such as p-type silicon, having an n+ source implant or diffusion 14 and an n+ drain implant or diffusion 16. A source electrode 18 and a drain electrode 20 are each comprised of an electrical conductor and may be a layer of metalization or polysilicon. A gate region is formed between the source diffusion 14 and the drain diffusion 16. The gate region underlies a layer of gate insulator or oxide 22. For the illustrated embodiment the gate oxide layer 22 is comprised of silicon dioxide ($SiO_2$). Overlying the $SiO_2$ layer 22 is a gate electrode 24 comprised of an electrical conductor, such as a layer of metalization or polysilicon. The dimensions of the ISD 10 are comparable with those of a conventional MOSFET device. By example, the width of the channel between the source and drain regions is approximately 0.1 to approximately 10 microns and the thickness of the gate oxide 22 is approximately 0.01 to approximately 0.1 microns.

The device described thus far is represents a conventional n-channel MOSFET having a current input terminal, a current output terminal, and a gate terminal for controlling the current flow through the device. However, the ISD 10 further includes ions 26, such as sodium ions (Na+), that are selected for a property of being mobile within the gate oxide material. The ions 26 are incorporated, during fabrication of the ISD 10, within the gate oxide layer 22. The ions 26 may be introduced into the gate oxide as the oxide is deposited or may be introduced subsequent to oxide formation through a diffusion or implantation process. By whatever means they are incorporated within the oxide layer 22, the ions 26 drift or migrate within the gate oxide layer 2 under the influence of an applied electric field. As is shown in FIG. 1, when a positive voltage is applied to the gate electrode 24 the positively charged sodium ions 26 are repelled from the gate electrode 24 and drift to and gradually accumulate at the silicon/silicon dioxide interface 12a. This gradual accumulation of Na+ ions at the interface 12a also gradually increases the conductivity of the channel for majority charge carriers (electrons) and has the effect of increasing the current flow through the ISD 10. If a negative voltage is applied to the gate electrode 24 the inverse effect occurs. That is, the positively charged ions are attracted to the silicon dioxide/gate electrode interface 12b and away from the interface 12a. As a result, the current flow through the ISD 10 varies over time as a function of the polarity and the magnitude of the potential applied to the gate electrode 24, and as a function of the drift rate of the ions 26 within the gate oxide.

Figure 4:
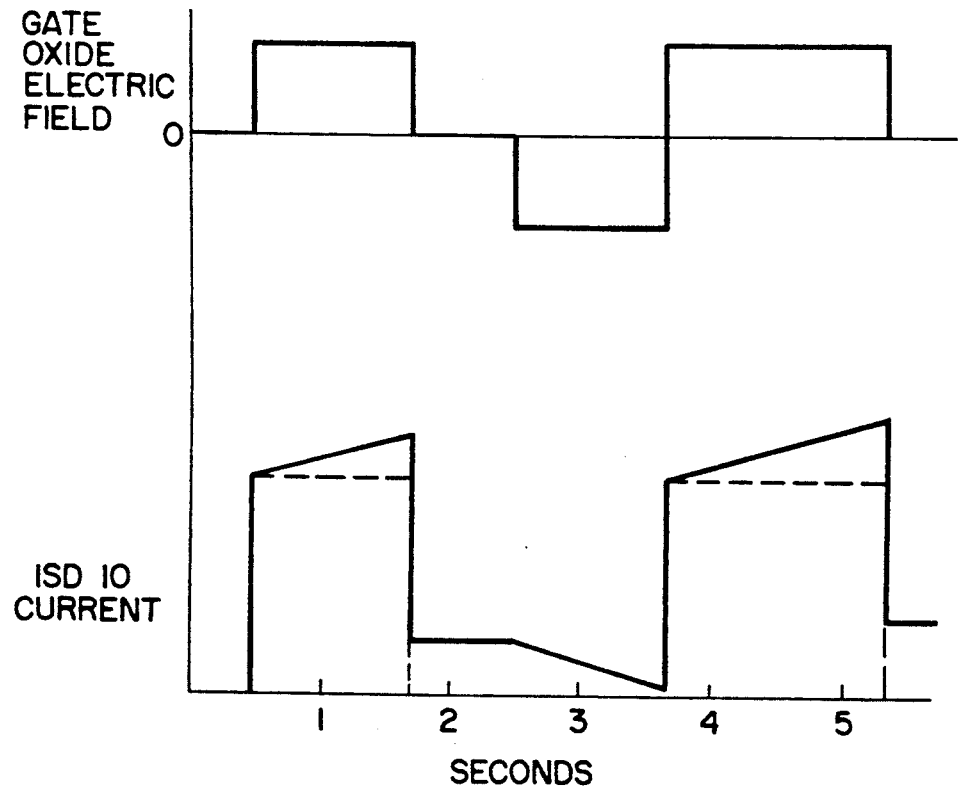
FIG. 4 is a graph depicting a change in current flow through the artificial ionic synapse of FIG. 1 as a result of an electric field.

FIG. 4 depicts an electric field potential that is applied across the gate oxide 22 and the change in current flow through the ISD 10 as a result of the applied potential. The dashed trace shows the response of a conventional MOSFET device to the applied potential and assumes a device threshold of zero. Operation of the ISD 10 preferably occurs upon the linear slope of the current response. As depicted in FIG. 4 the time constants associated with the ISD 10 may be milliseconds. Time constants of hours or even days may also be achieved. While such time constants may appear slow by conventional standards, if biological systems are being modeled or simulated the relatively slow response of the ISD 10 may, in many applications, be desirable. That is, the response time of the ISD 10 is comparable with the response times observed in biological nervous tissue.

The time constant for the drifting of Na+ ions in the gate oxide layer 22 is temperature dependent. Thus, temperature control of the operating ISD 10 is a consideration to obtain uniform performance over an extended interval of time.

The specific concentration of ions in the $SiO_2$ gate oxide layer 22 is, to a large measure, application specific. It is noted that an applied gate potential need only result in as little as a small fraction of a monolayer of Na+ at the interface 12a to realize a significant change in ISD 10 conductivity. In general, the interface surface density concentration of ions 26 is preferably greater than $10^{10}$ ions/cm$^2$, with a typical concentration being in the range of approximately $10^{12}$ ions/cm$^2$ to $10^{13}$ ions/cm$^2$. In this regard it is further noted that under typical cleanroom semiconductor processing conditions that even a trace amount of Na is considered as an impurity that can have an adverse impact upon conventional device performance.

Other ions, known to be mobile in $SiO_2$, may also be employed. These include, by example, ions of lithium, potassium and fluoride. Lithium and potassium are positive ions, like sodium, whereas the fluoride ion is negative. However, in either case the net effect of the drifting charge is the same, although the two types of ions drift in opposite directions under the influence of the applied field. Thus, other ions or a combination of ions may be substituted for sodium in the ISD 10 to yield the same functional result. In general, a suitable ionic species is one that is capable of movement within the selected gate insulator material.

As described thus far the teaching of the invention has been directed to a MOSFET-like device capable of operation as a modifiable excitatory synapse in an artificial neural network. The ISD 10 changes synaptic strength according to a Hebb-type rule, just as biological excitatory synapses have been observed to do. Basically stated, the Hebb rule is one of a number of different rules for adjusting connection strengths between elements of an artificial neural network. The general Hebb rule may be stated as "Adjust the strength of the connection between two units A and B in proportion to the product of their simultaneous activation". In this formulation, if the product is negative, the change makes the connection more inhibitory, and if the product is positive, the change makes the connection more excitatory. However, this multiplicative form of the Hebb rule is not essential to the operation of the ISD 10. In point of fact, the ISD 10 can be seen to operate in accordance with a linear Hebb-like rule.

Figure 2:
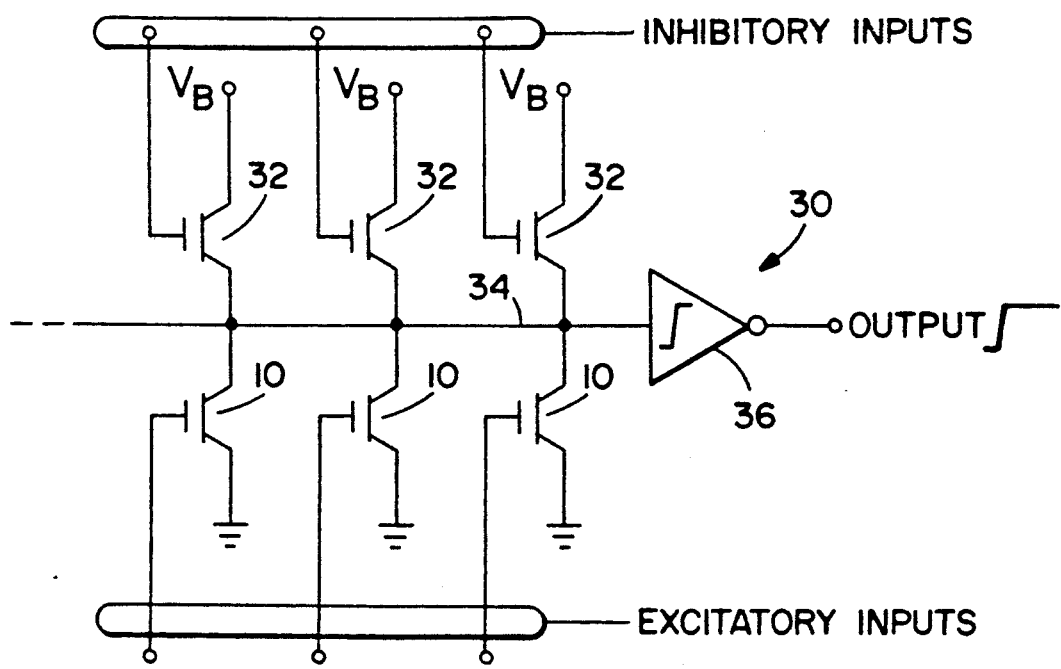
FIG. 2 is a schematic diagram showing one embodiment of an artificial neuron that is constructed in accordance with the invention.

FIG. 2 illustrates one embodiment of circuitry for an artificial neuron 30 incorporating the modifiable excitatory ISDs 10 and also fixed inhibitory synapses 32. This embodiment outputs a DC potential signal and not pulses. A central conducting line 34 functions to form an average potential through current averaging. The excitatory synapses (ISD 10s) couple line 34 to ground potential and tend to lower the potential of the line 34. The strength of this effect is a function of the instantaneous state of excitatory inputs to the individual ISD 10s as well as on the state of the ionic distribution within each of the ISD 10s. The inhibitory synapses 32 connect the central line 34 to a potential ($V_B$) and tend to increase the potential on the line 34. The strength of this effect depends only on the inputs to the inhibitory synapses 32, in that they are not modifiable. In this embodiment of the invention the inhibitory synapses 32 are comprised of conventional MOSFETs having no mobile ions.

It should be realized that more or less than the illustrated number of artificial inhibitory and excitatory synapses may be employed. It should also be realized that an artificial neuron does not require equal numbers of artificial inhibitory and excitatory synapses.

The central line 34 performs a summation of all of the synaptic inputs modified by both the sign and the strength of each synapse. The central line 34 is coupled to an input of a high gain inverting threshold amplifier 36. Amplifier 36 functions as the output of the artificial neuron 30 and is inverting so as to produce a correct polarity of voltage that is input to further synapses, not shown, that are fed from the output of the amplifier 36 to form an artificial neural network. The non-linear nature of the amplifier 36, in switching the output signal from approximately zero potential to a maximum potential at some preset input threshold, is important to the functioning of neural networks. This aspect of neural computation is well known and is not discussed further herein.

Figure 3:
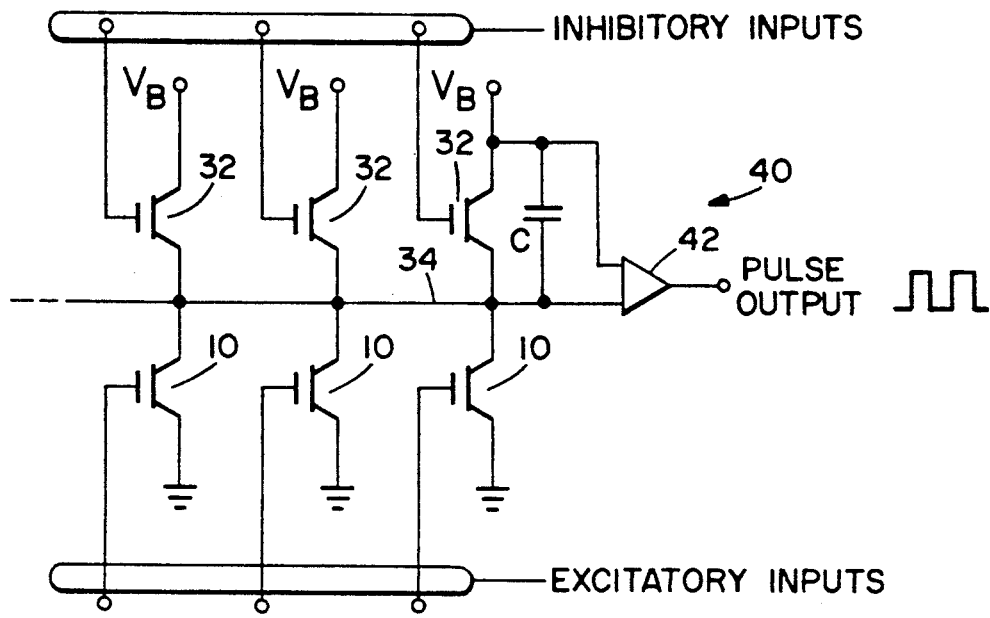
FIG. 3 is a schematic diagram showing another embodiment of an artificial neuron network that is constructed in accordance with the invention.

A further embodiment of an artificial neuron is shown in FIG. 3. This embodiment operates in a pulsed mode rather than the continuous mode of FIG. 2. The synapses 10 and 32 and the central line 34 operate as in FIG. 2. A capacitor (C) is coupled between the central line 34 and $V_B$ and functions as a charge integrator. Inputs to the synapses 10 and 32 are pulse streams from other artificial neurons 40. The pulse rate, pulse amplitude and pulse width of the synaptic inputs all determine a net charge that accumulates on C, as does the sign and strength of the synaptic connections. The voltage appearing across C controls a pulse generator 42 which outputs pulse streams with a rate that is analogous to the voltage output of the circuit of FIG. 2. In general, the artificial neuron 40 functions as a relaxation oscillator.

It is not immediately apparent that substituting pulse rate information, as in FIG. 3, for voltage level information, as in FIG. 2, should have any substantive effect on the computational power of a neural network. However, it is known that most biological neurons function primarily in the pulse mode.

Although the invention has been described with respect to specific embodiments it should be apparent that the ISD 10 enables the modelling of a number of possible neuron configurations other than the two examples described above. Furthermore, it should be realized that significant numbers of the ISDs may be fabricated upon a common substrate and interconnected by conventional semiconductor processing techniques into an artificial neural network. Also, although described in the context of an n-channel device the ISD could also be fabricated as a p-channel device to provide modifiable inhibitory synapses. Also, other material systems may be employed so long as the selected ionic species exhibits mobility within the gate insulator. Therefore, while the invention has been particularly shown and described with respect to specific embodiments thereof, it will be understood by those skilled in the art that changes in form and details may be made therein without departing from the scope and spirit of the invention.

Having thus described my invention, what I claim as new, and desire to secure by Letters Patent is:

1. An artificial neuron comprising:
   at least one means for providing an excitatory input synapse;
   at least one means for providing an inhibitory input synapse;
   means, coupled to the at least one excitatory input synapse means and to the at least one inhibitory input synapse means, for summing electrical signals input thereon; and
   output means, having an input coupled to the summing means, for generating a neuron output signal in accordance with the summed electrical signals, wherein
   the at least one excitatory input synapse means is comprised of an electrical device that includes a region having ions contained therein, the ions being responsive to an electrical potential applied to an input terminal of the device for increasing a conduction of electrical current through the device, wherein the ions are intentionally placed into the region with a concentration sufficient to increase the conduction of electrical current so as to cause the device to operate in a manner analogous to an excitatory neural synapse with respect to an input stimulus.

2. An artificial neuron as set forth in claim 1, wherein the at least one excitatory input synapse means is comprised of a Metal Oxide Semiconductor Field Effect Transistor (MOSFET) device that includes a substrate, a source electrode coupled to a source region formed within the substrate, a drain electrode coupled to a drain region formed within the substrate, and wherein the input terminal includes a gate terminal, the gate terminal being disposed between the source region and the drain region for inducing a channel region within the substrate in response to an electrical potential applied to the gate terminal, the gate terminal being spaced apart from the substrate by the region which includes a layer of electrically insulating material, wherein the electrically insulating material includes ions of a type selected for being mobile within the electrically insulating material such that, in response to an electrical potential applied to the gate terminal, the ions migrate within the electrically insulating material in such a manner as to increase a flow of electrical current through the channel region.

3. An artificial neuron as set forth in claim 2 wherein the electrically insulating material is comprised of $SiO_2$ and wherein the ions are selected from the group consisting of ions of Li, Na, K, and F.

4. An artificial neuron as set forth in claim 3 wherein the substrate is comprised of p-type silicon and wherein the source region and the drain region are each comprised of n+ silicon.

5. An artificial neuron as set forth in claim 1 wherein the at least one inhibitory input synapse means is comprised of a MOSFET device.

6. An artificial neuron as set forth in claim 1 wherein the output means is comprised of amplifier means responsive to a predetermined magnitude of the summed electrical signals for switching the neuron output signal from a first state to a second state.

7. An artificial neuron as set forth in claim 1 and further comprising means, coupled to an output of the summing means, for integrating the summed electrical signals.

8. An artificial neural network comprising a plurality of interconnected artificial neurons, each of the artificial neurons comprising:
   at least one excitatory input synapse means for coupling the artificial neuron to an output signal of another one of the artificial neurons;
   at least one inhibitory input synapse means for coupling the artificial neuron to an output signal of another one of the artificial neurons;
   means, coupled to the at least one excitatory synapse means and to the at least one inhibitory synapse means, for summing electrical signals input thereon; and
   output means, having an input coupled to the summing means, for generating an artificial neuron output signal in accordance with the summed electrical signals, wherein
   the at least one excitatory synapse means is comprised of an electrical device that includes a region having ions contained therein, the ions being responsive to an electrical potential applied to an input terminal of the device for increasing a conduction of electrical current through the device, wherein the ions are intentionally placed into the region with a concentration sufficient to increase the conduction of electrical current so as to cause the device to operate in a manner analogous to an excitatory neural synapse with respect to an input stimulus.

9. An artificial neuron as set forth in claim 1 wherein the device includes an electrically conductive channel, wherein the region forms an interface with the channel, and wherein the concentration is sufficient to cause a density of ions at the interface that is greater than $10^{10}$ atoms/cm$^2$.

10. An artificial neural network as set forth in claim 8 wherein the device includes an electrically conductive channel, wherein the region forms an interface with the channel, and wherein the concentration is sufficient to cause a density of ions at the interface that is greater than $10^{10}$ atoms/cm$^2$.

11. An artificial neural network as set forth in claim 8 wherein said at least one inhibitory input synapse means has a fixed activation threshold.

* * * * *